(12) United States Patent
Geyl

(10) Patent No.: US 7,593,091 B2
(45) Date of Patent: Sep. 22, 2009

(54) IMAGING OR EXPOSURE DEVICE, IN PARTICULAR FOR MAKING AN ELECTRONIC MICROCIRCUIT

(75) Inventor: Roland Geyl, L'Hay-les-Roses (FR)

(73) Assignee: Sagem Defense Securite, Paris (FR)

( * ) Notice: Subject to any disclaimer, the term of this patent is extended or adjusted under 35 U.S.C. 154(b) by 326 days.

(21) Appl. No.: 11/666,073

(22) PCT Filed: Oct. 25, 2005

(86) PCT No.: PCT/FR2005/002654

§ 371 (c)(1),
(2), (4) Date: Apr. 23, 2007

(87) PCT Pub. No.: WO2006/045945

PCT Pub. Date: May 4, 2006

(65) Prior Publication Data

US 2008/0088811 A1  Apr. 17, 2008

(30) Foreign Application Priority Data

Oct. 27, 2004 (FR) ................... 04 11431

(51) Int. Cl.
*G03B 27/70* (2006.01)
*G03B 27/54* (2006.01)
*G03B 27/42* (2006.01)
*G02B 26/08* (2006.01)

(52) U.S. Cl. ............... 355/52; 355/67; 355/53; 359/224.1

(58) Field of Classification Search .......... 355/52, 355/53, 67; 430/30; 359/291, 578, 224.1
See application file for complete search history.

(56) References Cited

U.S. PATENT DOCUMENTS

| 5,684,566 A | 11/1997 | Stanton |
| 5,986,795 A | 11/1999 | Chapman et al. |
| 2003/0147161 A1 | 8/2003 | Shiraishi |
| 2003/0234970 A1 | 12/2003 | Phillips et al. |
| 2004/0013956 A1* | 1/2004 | Sogard ............. 430/30 |
| 2004/0027632 A1 | 2/2004 | Watson |
| 2004/0036940 A1 | 2/2004 | Hazelton et al. |
| 2004/0202898 A1 | 10/2004 | Van Dijsseldonk et al. |

FOREIGN PATENT DOCUMENTS

| EP | 0 744 641 A2 | 9/2001 |
| EP | 1 376 192 A2 | 1/2004 |

* cited by examiner

*Primary Examiner*—Peter B Kim
(74) *Attorney, Agent, or Firm*—Muncy, Geissler, Olds & Lowe, PLLC

(57) ABSTRACT

The imaging or exposure device comprises a radiation source (1), a reticle (3) mounted between the radiation source and an optical projection system (4) for shaping the radiation downstream from the reticle (3), the optical projection system (4) comprising a series of mirrors (7, 8, 10, 11) including at least two mirrors (10, 11) that are deformable, having deformer members (12, 13) connected to a control unit (14) associated with an image analyzer (15) to deform the two deformable mirrors in separate manner, firstly as a function of differences relative to an image quality setpoint, and second as a function of differences relative to an image distortion setpoint.

4 Claims, 1 Drawing Sheet

IMAGING OR EXPOSURE DEVICE, IN PARTICULAR FOR MAKING AN ELECTRONIC MICROCIRCUIT

The present invention relates to an imaging or exposure device, and more particularly although not exclusively to a device for making electronic microcircuits.

BACKGROUND OF THE INVENTION

It is known to make a multitude of electronic microcircuits simultaneously on a wafer by depositing in succession layers of conductive, semiconductive, or insulating material, which layers are etched by chemical etching after selective exposure through a mask that determines which zones are exposed so as to make them sensitive to chemical etching.

Each component of the microcircuit is obtained by a superposition of mutually contacting layers in a given area. In order to obtain high component density and constant performance of the components that are made, it is necessary for the images of the masks used in succession to present high quality, i.e. for the lines in the image to be very fine, with very little distortion so as to enable the successive images used for etching each of the layers to be put very accurately into register.

In order to make electronic microcircuits, it is known to use an exposure device that comprises a radiation source emitting radiation, a reticle formed by a mask that is to be reproduced, the mask being mounted between the radiation source and an optical projection system for shaping the radiation downstream from the reticle, with the optical projection system comprising a series of mirrors and/or lenses for making an image of the reticle.

Given the component density that is now being sought, it is necessary to make images presenting image quality of the order of a few tens of nanometers, and in order to obtain satisfactory registration between the successive images, it is then necessary for distortion to be of the order of a few nanometers.

Given the numerous disturbing factors within the optics, in particular temperature variations that can occur while making the different layers of the microcircuits, and the coefficients of thermal expansion of the materials constituting the support for the optical system, such accuracy can be obtained only if it is possible to compensate for the dimensional disturbances of the optical projection system.

US patent document US 2004/27632 discloses an imaging or exposure device comprising a radiation source emitting radiation, a reticle mounted between the radiation source and an optical projection system for shaping the radiation downstream from the reticle, the optical projection system comprising a series of mirrors for making an image of the reticle, some of the mirrors of the optical projection system being deformable mirrors including deformer members connected to a control unit.

OBJECT OF THE INVENTION

An object of the invention is to propose an imaging or exposure device that makes it possible to improve the compensation of the various disturbing effects.

SUMMARY OF THE INVENTION

According to the invention, an imaging or exposure device of the type described in the above-specified document is proposed, in which the control unit is associated with an image analyzer to deform one of the deformable mirrors mainly as a function of differences relative to an image quality setpoint, and to deform the other deformable mirror mainly as a function of differences relative to an image distortion setpoint.

Thus, the separate analysis and control of the quality of the image and of the distortion of the image make it possible to trigger corresponding control signals of the deformer members that are more accurate when deforming the deformable mirrors in order to correct the analyzed differences.

According to advantageous aspects of the invention, one of the deformable mirrors is disposed in the vicinity of the pupil of the optical projection system, and the corresponding deformer members are controlled mainly as a function of the image quality setpoint. Preferably, the other deformable mirror is an intermediate mirror between the pupil of the optical projection system and the image, and the corresponding deformer members are preferably controlled mainly as a function of the image distortion setpoint.

BRIEF DESCRIPTION OF THE DRAWING

Other characteristics and advantages of the invention appear on reading the following description of a particular, non-limiting embodiment of the invention with reference to the sole accompanying FIGURE which is a diagrammatic view of the exposure device of the invention.

DETAILED DESCRIPTION OF THE INVENTION

Figure 1:
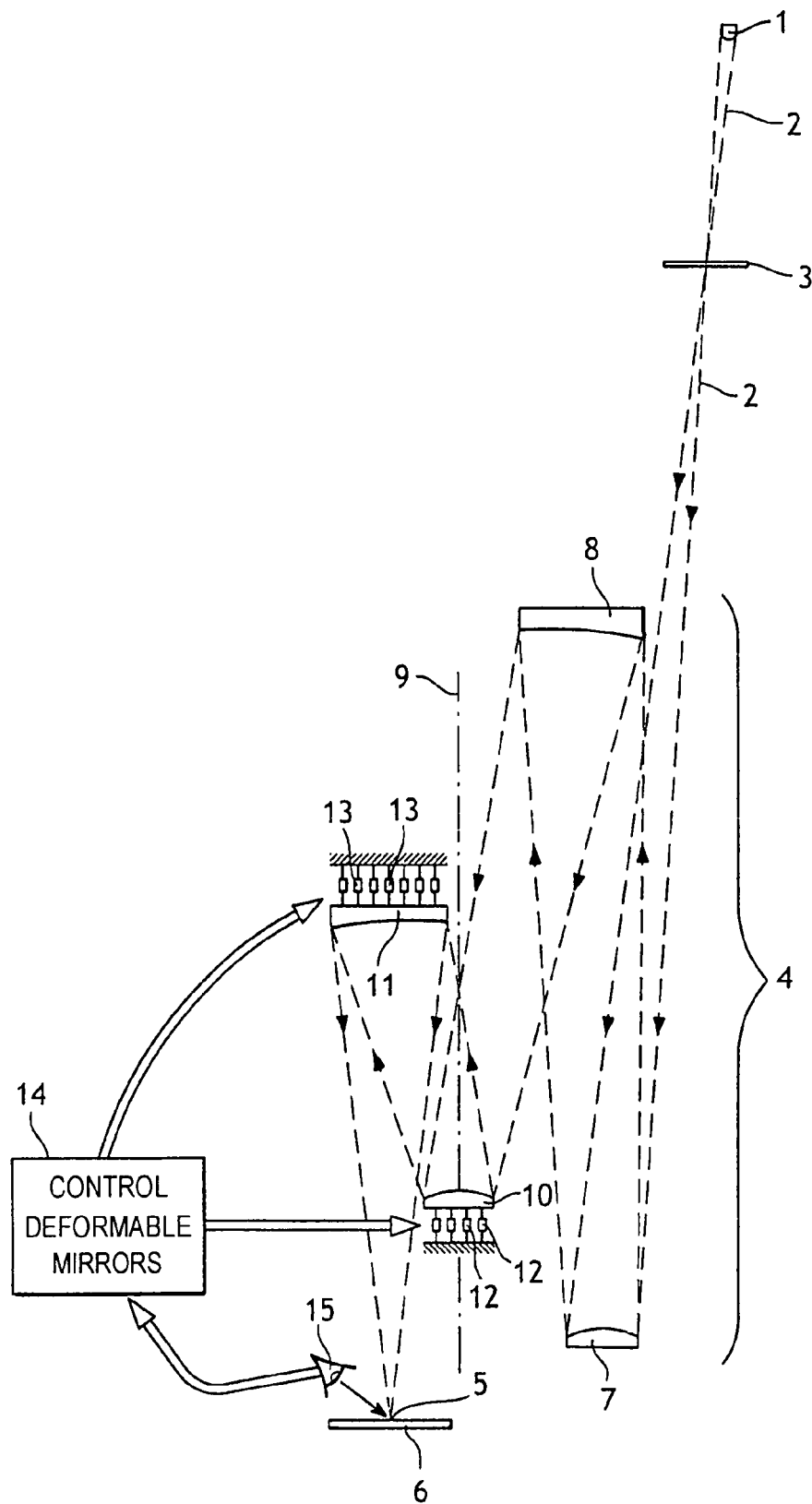

With reference to the FIGURE, the exposure device comprises, in conventional manner, a radiation source 1 that emits radiation 2 that is focused on a reticle 3. In an embodiment for electronic microcircuits presenting image quality of the kind defined, the radiation 1 is preferably radiation having a wavelength in the extreme ultraviolet, e.g. a wavelength of 13 nanometers (nm), and the reticle is constituted by the mask defining the microcircuits to be made on the layer that is being exposed.

In likewise conventional manner, the radiation passing through or reflected by the reticle 3 passes through an optical projection system given overall reference 4, comprising in this example a series of mirrors forming an image 5 on the article 6 to be exposed, e.g. a silicon wafer.

In the embodiment of the invention that is shown, the optical projection system 4 comprises a first mirror 7 of rigid structure reflecting the radiation 2 from the reticle 3 towards a second mirror 8 that is likewise of rigid structure. In conventional manner, the mirrors 7 and 8 are made up of mirror segments, each having a curvilinear surface of revolution about an optical axis 9 of the optical projection system.

Downstream from the mirror 8 on the path of the radiation 2, the optical projection system 4 comprises a first deformable mirror 10 placed in the vicinity of the pupil of the optical projection system, (where "pupil" is a term understood by the person skilled in the art). Downstream from the optical mirror 10, the optical projection system 4 has a second deformable mirror 11.

The deformable mirror 10 has deformer members 12, and the deformable mirror 11 has deformer members 13. The deformer members 12, 13 are connected to a control unit 14 that serves to control each of the deformer members 12, 13 individually. The control unit 14 receives information coming from an image analyzer 15 placed to analyze the image 5 while it is being made, or immediately after it has been made.

The control member 14 receives both image quality setpoints and the distortion of the image. During exposure, in a scanner type lithographic machine, relative movement is performed between the reticle 3 and the radiation source 1 to scan the mask forming the reticle 3. In parallel, the wafer 6 is moved to implement corresponding scanning of the image 5 that is to be made on the wafer 6. The actual image 5 as made is analyzed by the image analyzer 15. When the control member 14 observes a difference between the ideal image that ought to be obtained and the image that is observed by the analyzer 15, the control member 14 uses an inverse optimization algorithm to generate instructions for transmission to the deformer members 12, 13 to deform the deformable mirrors 10, 11 for the purpose of correcting the observed differences.

Preferably, in the invention, the deformable mirror 10 disposed at the pupil of the optical projection system 4 is controlled mainly as a function of the image quality setpoint, while the intermediate deformable mirror 11 is controlled mainly as a function of the image distortion setpoint, thus making it easier to separate the corrections in order to achieve better overall effectiveness.

In order to avoid fluctuations in the deformable mirrors that are too fast, the deformer members are preferably controlled at a rate of less than 1 hertz (Hz).

Naturally, the invention is not limited to the embodiment shown, and may comprise variant embodiments that would appear to the person skilled in the art without going beyond the ambit of the invention as defined by the claims.

In particular, although the optical projection system 4 is described in an embodiment that has only four mirrors, the optical projection system may have a larger number of mirrors, e.g. six mirrors, and may also have lenses interposed between certain mirrors.

When the optical projection system has a plurality of mirrors downstream from the mirror located at the pupil of the system, the second deformable mirror is preferably disposed immediately upstream of the image 5.

Although the device is shown with optimization including only deformation of the deformable mirrors 10 and 11, it is also possible to provide for other components to be moved (mirrors or lenses) in translation and in rotation in the six possible degrees of freedom.

Although in the embodiment shown the image analyzer 15 is disposed to undertake a posteriori analysis of the image 5, it is also possible, when the optical configuration makes this possible, to provide for image quality and image distortion information to be picked up by sensors placed at appropriate locations on the path of the radiation upstream from the image 5, i.e. while the image is being made.

Although the invention is described more particularly with reference to exposing an electronic microcircuit wafer, it can apply to any exposure or to any type of imaging.

The invention claimed is:

1. An imaging or exposure device comprising a radiation source (1) emitting radiation (2), a reticle (3) mounted between the radiation source and an optical projection system (4) for shaping the radiation downstream from the reticle (3), the optical projection system (4) comprising a series of mirrors (7, 8, 10, 11) for making an image (5) of the reticle (3), a plurality of mirrors (10, 11) of the optical projection system (4) being deformable mirrors including deformer members (12, 13) connected to a control unit (14), the device being characterized in that the number of deformable mirrors is strictly limited to two, the control unit being associated with an image analyzer (15) to deform one of the deformable mirrors (10) mainly as a function of differences relative to an image quality setpoint, and to deform the other deformable mirror mainly as a function of differences relative to an image distortion setpoint.

2. A device according to claim 1, characterized in that one of the deformable mirrors (10) is located at the pupil of the optical projection system (4), and the corresponding deformer members (12) are controlled mainly as a function of the image quality setpoint, the other deformable mirror (10) being an intermediate mirror between the pupil of the optical projection system and the image (5) and being controlled mainly as a function of the image distortion setpoint.

3. A device according to claim 2, characterized in that the intermediate deformable mirror (11) is disposed immediately upstream of the image (5).

4. A device according to claim 1, characterized in that the deformer members (12, 13) are controlled at a rate of less than 1 Hz.

* * * * *